United States Patent
Kim (10) Patent No.: US 9,281,814 B2
(45) Date of Patent: Mar. 8, 2016

(54) APPARATUS AND METHOD FOR GUIDING OF MULTI-FUNCTION SWITCH

(71) Applicant: Hyundai Motor Company, Seoul (KR)

(72) Inventor: Ki Chul Kim, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 628 days.

(21) Appl. No.: 13/688,122

(22) Filed: Nov. 28, 2012

(65) Prior Publication Data

US 2014/0118058 A1 May 1, 2014

(30) Foreign Application Priority Data

Oct. 31, 2012 (KR) .................. 10-2012-0122045

(51) Int. Cl.
| H01H 35/00 | (2006.01) |
| H03K 17/945 | (2006.01) |
| H01H 21/00 | (2006.01) |
| B60Q 1/14 | (2006.01) |
| H01H 3/02 | (2006.01) |

(52) U.S. Cl.
CPC ............ *H03K 17/945* (2013.01); *B60Q 1/1469* (2013.01); *H01H 21/00* (2013.01); *H01H 2003/0293* (2013.01); *H01H 2217/032* (2013.01)

(58) Field of Classification Search
CPC ....................................................... H01H 33/32
USPC .......................................................... 307/116
See application file for complete search history.

(56) References Cited

U.S. PATENT DOCUMENTS

| 6,842,111 | B1 * | 1/2005 | Smithson ...................... 340/468 |
| 7,217,894 | B2 * | 5/2007 | Miyako et al. ............. 200/61.54 |
| 8,849,506 | B2 * | 9/2014 | Suzuki ............................ 701/36 |
| 2012/0097508 | A1 | 4/2012 | Son et al. |

FOREIGN PATENT DOCUMENTS

| JP | 577679 A | 3/1993 |
| JP | 958375 A | 3/1997 |
| JP | 2010100261 A | 5/2010 |
| KR | 1019990053099 | 7/1999 |
| KR | 1020060067153 | 6/2006 |
| KR | 102012004228 | 5/2012 |

* cited by examiner

*Primary Examiner* — Stephen W Jackson
(74) *Attorney, Agent, or Firm* — Mintz Levin Cohn Ferris Glovsky and Popeo, P.C.; Peter F. Corless (57) ABSTRACT

Disclosed herein are an apparatus and a method for guiding a multi-function switch guide. The apparatus for guiding a multi-function switch includes: a sensor unit that is disposed on an operating lever of a multi-function switch of a vehicle to sense an approach of a user or an operation of the operating lever; a switch state determining unit that determines a current operation state of the multi-function switch, when the approach of the user or the operation of the operating lever is sensed by the sensor unit; an information detection unit that detects a lever operation method corresponding to the current operation state of the multi-function switch; and an output control unit that performs a control to display the detected lever operation method.

19 Claims, 5 Drawing Sheets

APPARATUS AND METHOD FOR GUIDING OF MULTI-FUNCTION SWITCH

CROSS-REFERENCE TO RELATED APPLICATION

This application is based on and claims priority from Korean Patent Application No. 10-2012-0122045, filed on Oct. 31, 2012 in the Korean Intellectual Property Office, the disclosure of which is incorporated herein in its entirety by reference.

BACKGROUND

1. Field of the Invention

The present invention relates to an apparatus and a method for guiding a multi-function switch, and more particularly, to an apparatus and a method for displaying an operation method of a multi-function switch.

2. Description of the Prior Art

A multi-function switch is a switch for performing multi-function/multi-direction control. In the automotive industry, a driver confirms functions and an operation method of an operating lever, and the like, by small symbols printed on the operating lever. However, it is difficult for a driver to identify these symbols displayed on the operating lever one by one while driving. Additionally, drivers are often operating this multi-function switch blindly night since a light is typically not mounted in the switch to illuminate the symbols. Therefore, it is difficult for a driver to operate the multi-function switch when a driver cannot see with operation performs which function.

SUMMARY

Accordingly, the present invention has been made to solve the above-mentioned problems occurring in the prior art while advantages achieved by the prior art are maintained intact. One object of the present invention is to provide an apparatus and a method for guiding a multi-function switch so as to guide an operation of a multi-function switch by displaying a lever operation method of a multi-function switch when a user approaches the multi-function switch or when which is being operated.

Another object of the present invention is to provide an apparatus and a method for to guiding a multi-function switch increases user convenience of lever operation by a user by displaying a lever operation method corresponding to a current operation state of a lever to be operated by a user on a display.

In one aspect of the present invention, there is provided an apparatus for guiding a multi-function switch, including: a sensor unit that is disposed on an operating lever of a multi-function switch of a vehicle to sense an approach of a user or an operation of the operating lever; a switch state determining unit, executed by a processor within a controller, that determines a current operation state of the multi-function switch, when the approach of the user or the operation of the operating lever is sensed by the sensor unit; an information detection unit, executed by the processor, that detects a lever operation method corresponding to the current operation state of the multi-function switch; and an output control unit, executed by the processor, configured to display the detected lever operation method.

The sensor unit may include: a first sensor that is disposed on any one of the operating levers disposed on both sides of the multi-function switch to sense the approach of the user or the operation of any one operating lever; and a second sensor that is disposed at the other one of the operating levers disposed at both sides of the multi-function switch to sense the approach of the user or the operation of the other operating lever.

The switch state determining unit may be configured to determine the approach of the user or the current operation state of the operating lever of which the operation is sensed, when the approach of the user or the operation of the operating lever is sensed by at least one of the first sensor and the second sensor. More specifically, the sensor may include a proximity recognition sensor or a touch sensor. The sensor unit may include a sensor that senses motion and rotation operations in all directions of the operating lever.

The apparatus for guiding a multi-function switch may further include: an output unit that is connected with a cluster of the vehicle to output at least one of the detected lever operation methods to the cluster according to control signals from the output control unit.

The apparatus for guiding a multi-function switch may further include: a storage device, such as a memory, hard drive, etc., that stores each state information corresponding to functions implemented by the operating lever of the multi-function switch and the lever operation methods for each state. Furthermore, the output control unit may be configured to display state information on the current operation state of the multi-function switch.

In another aspect of the present invention, there is provided an apparatus for guiding a multi-function switch may include: a switch state determining unit, executed by a processor within a controller, that determines a current operation state of a multi-function switch when operation signals are input from the multi-function switch according to an operation of the operation lever disposed on the multi-function switch of a vehicle; an information detection unit, executed by the controller, that detects a lever operation method corresponding to the current operation state of the multi-function switch; and an output control unit, executed by the processor, that displays the detected lever operation method accordingly.

The switch state determining unit may be configured to determine a current operation state of the operating lever of which the operation is sensed from the operation signals, among the operating levers disposed on the multi-function switch.

In still another aspect of the present invention, there is provided a method for guiding a multi-function switch, including: sensing an approach of a user or an operation of the operating lever by a sensor unit disposed on an operating lever of a multi-function switch of a vehicle; determining a current operation state of the multi-function switch, when the approach of the user or the operation of the operating lever is sensed by the sensor unit; detecting a lever operation method corresponding to the current operation state of the multi-function switch; and displaying the detected lever operation method accordingly.

The sensing may include: sensing an approach of a user to any one of the operating levers disposed at both sides of the multi-function switch or an operation thereof; and sensing the approach of the user to the other one of the operating levers disposed at both sides of the multi-function switch or the operation thereof.

In the determining, the approach of the user or a current operation state of the operating lever of which the operation is detected may be determined, among the operating levers disposed on both sides of the multi-function switch, is determined.

The method for guiding a multi-function switch may further include: prior to the detecting, storing each state information corresponding to functions implemented by the operating lever of the multi-function switch and the lever operation methods for each state.

The method for guiding a multi-function switch may further include: displaying at least one of the detected operation state information and lever operation method on the cluster of the vehicle.

The method for guiding a multi-function switch may further include: performing a control to display state information on the current operation state of the multi-function switch.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles and plug-in hybrid electric vehicles, and other vehicles which include both an engine and a motor to power the vehicle. As referred to herein, a hybrid vehicle is a vehicle that has two or more sources of power, for example both gasoline-powered and electric-powered vehicles.

Additionally, it is understood that the below processing "units" are executed by at least one controller. The term controller refers to a hardware device that includes a memory and a processor. The memory is configured to store the modules and the processor is specifically configured to execute said modules to perform one or more processes which are described further below.

Furthermore, the control logic of the present invention may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Hereinafter, exemplary embodiments of the present invention will be described in detail with reference to the accompanying drawings.

Figure 1:
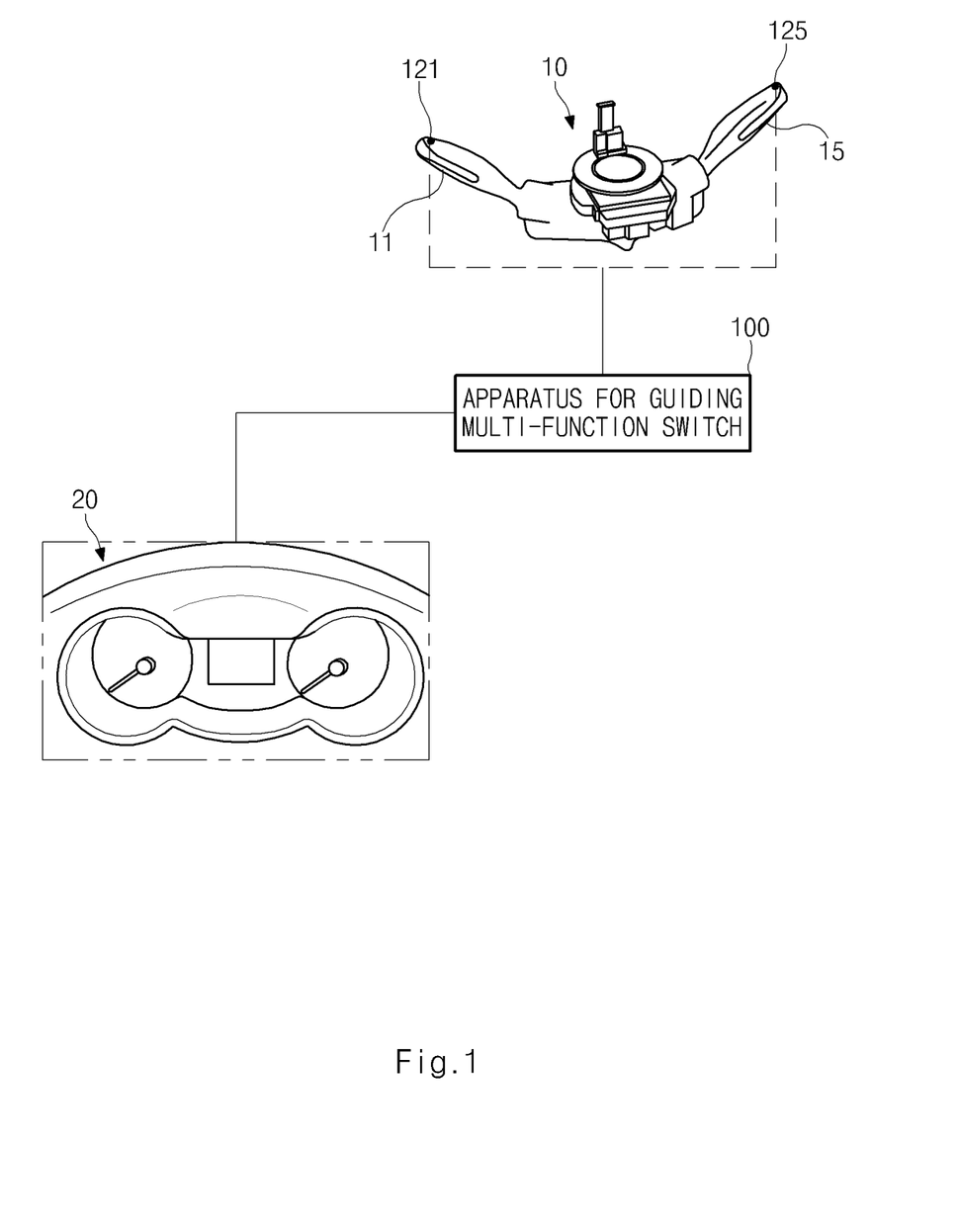
FIG. 1 is a configuration diagram illustrating a connection structure of an apparatus for guiding a multi-function switch according to an exemplary embodiment of the present invention.

FIG. 1 is a configuration diagram illustrating a connection structure of an apparatus for guiding a multi-function switch according to an embodiment of the present invention. Referring to FIG. 1, the apparatus 100 for guiding a multi-function switch 10 according to an embodiment of the present invention senses an approach of a user or an operation of a corresponding operating lever by using a sensor 121 and 125 disposed on an operating lever 11, 15 of a multi-function switch 10 to display state information and an operation method of the corresponding operating lever through a connected cluster 20, so that a user may easily detect the state and operating method of the operating lever.

Here, the multi-function switch is mounted in a steering column of a vehicle and is a switch operating a headlamp, a turn signal lamp, a wiper, a washer, and the like, that are mounted in a vehicle. However, it should be noted that the present invention is not limited solely to this embodiment and may also be applied to the cruise control, and other multi-function switches in the vehicle.

In this case, the multi-function switch 10 is provided with at least one operating lever, that is, a first operating lever 11 and a second operating lever 15 at the left and right sides so as to be easily operated by both hands of a user and outputs a signal that operates a headlamp, a turn signal lamp, a wiper, a washer, and the like, that are mounted in a vehicle, according to the operations of the first operating lever and the second operating lever. Here, among the operating levers disposed at the left and right sides of the multi-function switch, the first operating lever 11 is an operating lever that is disposed at one thereof, and the second operating lever 15 is an operating lever disposed at the other side thereof.

The apparatus 100 for guiding a multi-function switch according to the embodiment of the present invention previously stores state information corresponding to each function and lever operation methods for each state that can be implemented by the first operating lever and the second operating lever. In this case, the apparatus for guiding a multi-function switch includes sensors 121, 125 that are disposed on the first operating lever and the second operating lever so as to sense the approach of the user to the first operating lever or the second operation lever or an operation thereof.

Accordingly, the apparatus for guiding a multi-function switch senses the approach or operation of a user by the sensors 121, 125 disposed on the first operating lever 11 and the second operating lever 15 to provide the lever operation method corresponding to the current state of the corresponding operating lever to a user.

Hereinafter, a detailed configuration of the apparatus for guiding a multi-function switch will be described with reference to an embodiment of FIG. 2.

Figure 2:
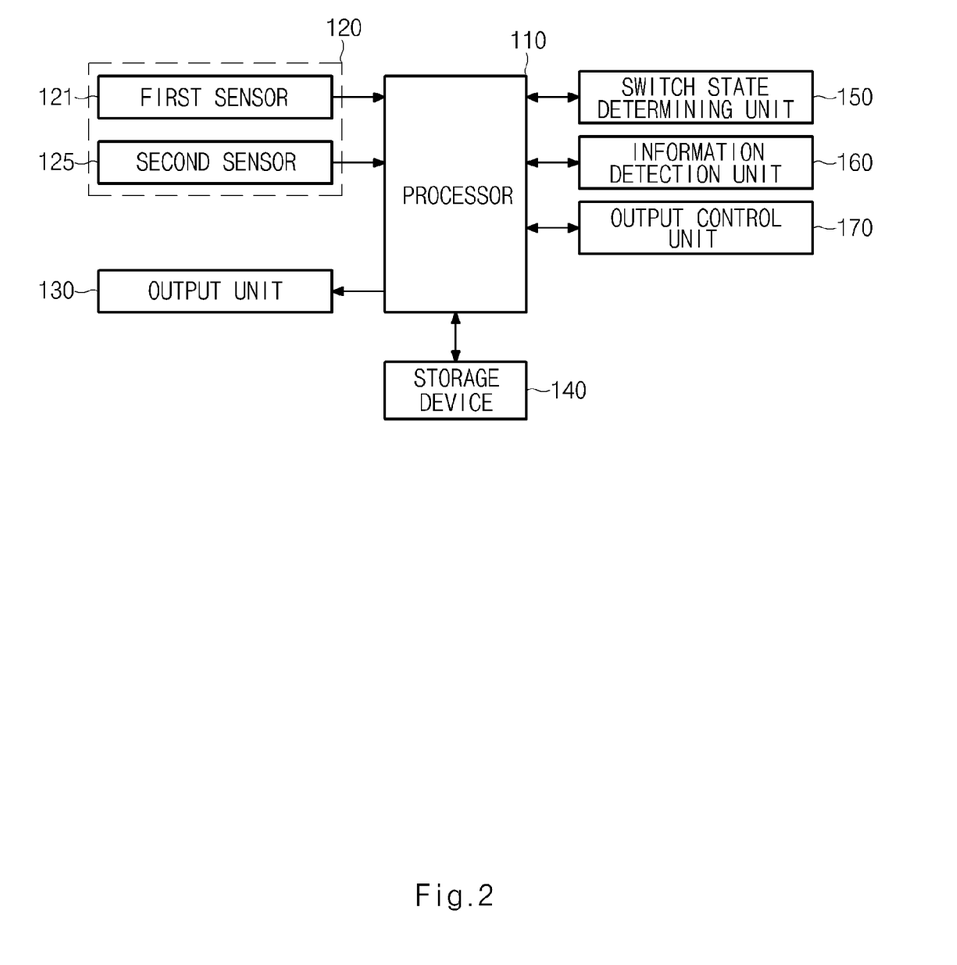
FIG. 2 is a block diagram illustrating a configuration of the apparatus for guiding a multi-function switch according to the exemplary embodiment of the present invention.

FIG. 2 is a block diagram illustrating a configuration of the apparatus for guiding a multi-function switch according to an exemplary embodiment of the present invention. Referring to FIG. 2, the apparatus for guiding a multi-function switch according to the embodiment of the present invention may include a processor 110, a sensor unit 120, an output unit 130, a storage device 140, a switch state determining unit 150, an information detection unit 160, and an output control unit 170. In this configuration, the processor 110 controls operations of each unit of the apparatus for guiding a multi-function switch according to the embodiment of the present invention.

Further, the sensor unit 120 is disposed on the operating lever of the multi-function switch of a vehicle to sense the approach of the user to the operating lever or the operation thereof. As illustrated in FIG. 1, the sensor unit 120 may include a first sensor 121 that is disposed on the first operating lever and a second sensor 125 that is disposed on the second operating lever. In this configuration, the first sensor 121 senses the approach or operation of the first operating lever by the user and the second sensor 125 senses the approach of the user to the second operating lever or the operation thereof.

In this case, the sensor unit 120 includes a proximity recognition sensor or a touch sensor to sense the approach of the user to the first operating lever and the second operating lever. Meanwhile, the sensor unit 120 may further include a sensor that senses motion and rotation operations in all directions of the first operating lever and the second operating lever.

The output unit 130 outputs the state information of the operating lever or the lever operation methods to a connected display unit (e.g., a screen) according to control signals from the output control unit 170. For example, the output unit 130 is connected with a cluster of a vehicle to output the state information of the operating lever or the lever operation method to the connected cluster. This is only an example and therefore, any member that can display the state information of the operating lever or the lever operation method may be used and the state information of the operating lever or the lever operating method may be output through a monitor or a navigation screen that is mounted in a vehicle.

The storage device 140 stores a setting value, and the like, for operating the apparatus for guiding a multi-function switch. Further, the storage device 140 stores state information to corresponding to functions implemented by the operating levers of the multi-function switch and the lever operating methods for each state and provides the corresponding information according to the request of the information detection unit 160. The storage device 140 is understood to include a memory, hard drive, etc. or any other known device that may store data.

When the approach of the user or the operation of the operating lever is sensed by the sensor unit 120, the switch state determining unit 150 determines the current operation state of the multi-function switch. In this case, the switch state determining unit 150 determines the approach of the user or the current operation state of the operating lever of which the operation is sensed, when the approach of the user or the operation of the operating lever is sensed by at least one of the first sensor 121 and the second sensor 125.

For example, when the approach of the user to the first operating lever or the operation thereof is sensed by the first sensor 121, the switch state determining unit 150 may determine the current operation state of the first operating lever. As another example, when the approach of the user to the first operating lever and the second operating lever or the operation thereof is sensed by the first sensor 121 and the second sensor 125, the switch state determining unit 150 may also determine the current operation state of the first operating lever and the second operating lever, respectively.

Here, the switch state determining unit 150 may receive the state information from the multi-function switch to determine the current operation state of the corresponding operation lever when the approach of the user is sensed by at least one of the first sensor 121 or the second sensor 125.

Meanwhile, the configuration of the sensor unit 120 may be omitted according to the embodiment. When the configuration of the sensor unit 120 is omitted, the switch state to determining unit 150 may determine the current operational state of the multi-function switch when the operating signal is input from the multi-function switch according to the operation of the operating lever disposed on the multi-function switch.

The information detection unit 160 detects the lever operation method corresponding to the current operation state of the multi-function switch that is determined by the switch state determining unit 150. In this case, the information detection unit 160 identifies the lever operation methods for each state and detects the approach of the user or the lever operation method corresponding to the current operation state of the operating lever of which the operation is sensed.

For example, when the approach of the user to the first operating lever or the operation thereof is sensed by the first sensor 121, the information detection unit 160 may determine the lever operating method corresponding to the current operation state of the first operating lever. As another example, when the approach of the user to the first operating lever and the second operating lever or the operation thereof is sensed by the first sensor 121 and the second sensor 125, the information detection unit 160 may also detect the lever operation methods corresponding to the current operation state of the first operating lever and the second operating lever, respectively.

The output control unit 170 outputs control signals so as to display the lever operation method detected by the information detection unit 160 for the approach of the user or the operating lever of which the operation is sensed. Further, the output control unit 170 outputs the control signals to display the information related to the approach of the user or the current operation state of the operating lever of which the operation is sensed.

In this case, the output control unit 170 may output the control signal (first control signal) to display the approach of the user or the information on the current operation state of the operating to lever of which the operation is sensed before the lever operation methods of the approach of the user or the operating lever of which the operation is sensed is displayed and may output the control signal (second control signal) to display the approach of the user or the lever operation method of the operating lever of which the operation is sensed after a predetermined time lapses. Meanwhile, the output control unit 170 may simultaneously output the first control signal and the second control signal.

In this case, the display unit connected with the output unit 130, for example, the cluster 20 may display the state information of the operating lever and the lever operation method, respectively, at a different time or simultaneously. In this case, the embodiment in which the state information of the operating lever and the lever operation method are displayed will be described with reference to FIGS. 3A and 4.

Figure 3A:
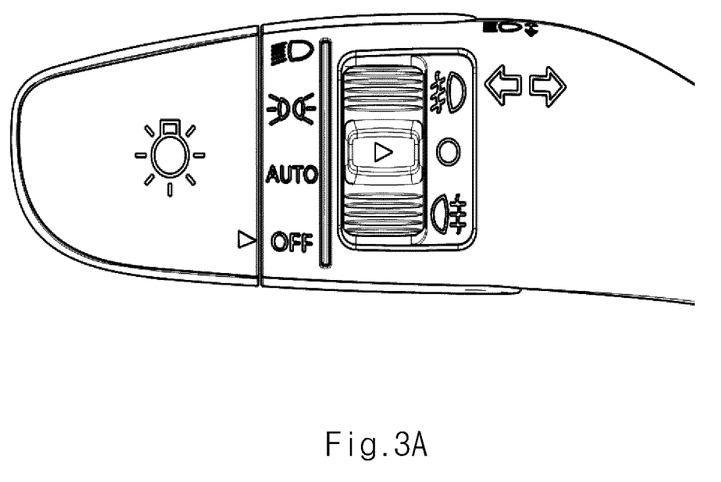
FIGS. 3A and 3B are exemplified diagrams referenced for describing an operation of a state information display of the apparatus for guiding a multi-function switch according to the exemplary embodiment of the present invention.
Figure 3B:
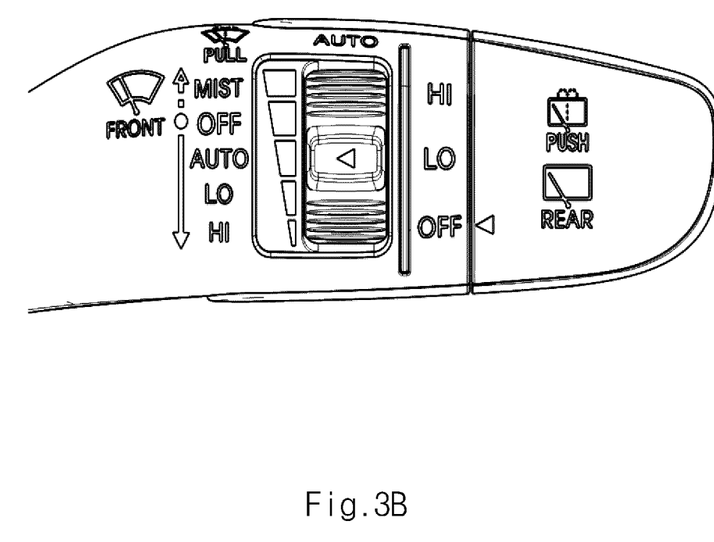

FIGS. 3A and 3B are exemplified diagrams referenced for describing an operation of a state information display of the apparatus for guiding a multi-function switch according to the embodiment of the present invention. First, FIG. 3A illustrates an exemplary embodiment in which the state information of the first operating lever illustrated in FIG. 1 is displayed on the cluster. Referring to FIG. 3A, the first operating lever includes functions, such as a on/off operation, an intensity control, and the like, of a headlamp, an on/off operation of a turn signal lamp, and the like.

The apparatus for guiding a multi-function switch determines the current operation state of the first operating lever when the approach of the user to the first operating lever or the operation thereof is sensed to display the state information, for example, a state image, an icon, and the like, on the connected cluster 20. In this case, the user may confirm the current state of the first to operating lever, for example, a turn off of a headlamp, a turn off of a turn signal lamp, and the like, by the state image illustrated in FIG. 3A.

Meanwhile, FIG. 3B illustrates the embodiment in which the state information of the second operating lever illustrated in FIG. 1 is displayed on the cluster. Referring to FIG. 3B, the second operating lever includes functions for a wiper on/off operation and an intensity control operation of the front and back of a vehicle, a washer on/off operation of the front and back thereof, and the like.

The apparatus for guiding a multi-function switch determines the current operation state of the second operating lever when the approach of the user to the second operating lever or the operation thereof is sensed to display the state information, for example, a state image, an icon, and the like, on the connected cluster. In this case, the user may confirm the current state of the second operating lever, for example, turn off of a front wiper, turn off of a back wiper, and the like, by the state image illustrated in FIG. 3B.

Figure 4:
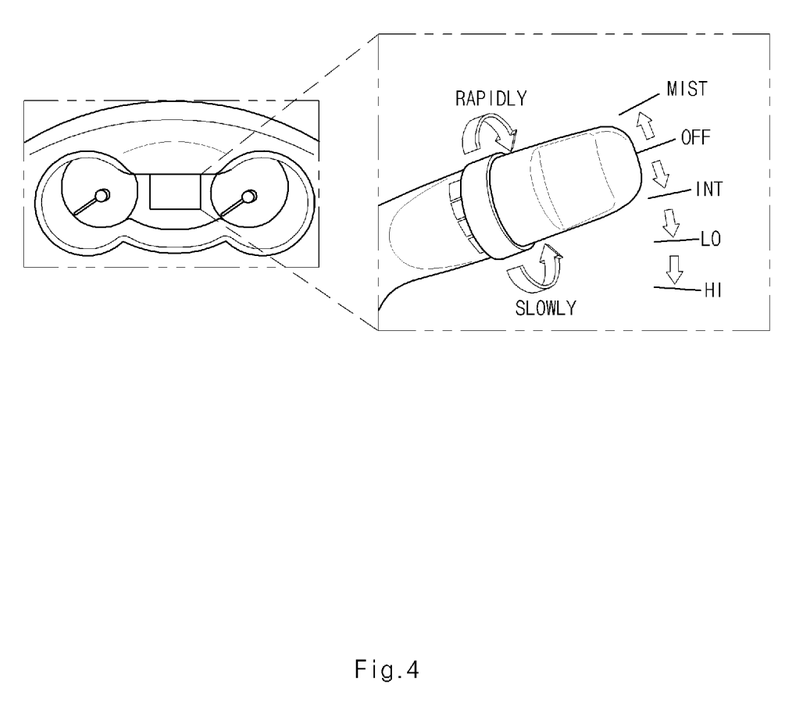
FIG. 4 is an exemplified diagram referenced for describing a display operation of a lever operation method for the apparatus for guiding a multi-function switch according to the exemplary embodiment of the present invention.

FIG. 4 is an exemplified diagram referenced for describing a display operation of a lever operation method of the apparatus for guiding a multi-function switch according to the exemplary embodiment of the present invention. In particular, FIG. 4 displays the lever operation method based on the second operating lever illustrated in FIG. 1.

Referring to FIG. 4, the apparatus for guiding a multi-function switch determines the current operation state of the second operating lever when the approach of the user to the second operating lever or the operation thereof is sensed and displays the lever operation method corresponding to the current operation state of the second operating lever on the connected cluster. In FIG. 4, the current operation state of the second operating lever is in a front wiper off state and to therefore, displays the lever operation method on the connected cluster, based it is likely that the driver will want to turn off the front wiper.

For example, when the user operates the second operating lever forward once based on the position of the user in the front wiper off state by the lever operation method illustrated in FIG. 4, it can be confirmed that the front wiper is in a 'MIST' state. Meanwhile, it can be confirmed that when the user operates the second operating lever backward once, the front wiper is in a 'AUTO' state, when the user operates the second operating lever backward twice, the front wiper is in a 'LO' state, and when the user operates the second operating lever backward three times, the front wiper is in a 'HI' state.

Similarly, it can be confirmed that when the second operating lever rotates forward, the speed of the front wiper is controlled rapidly and when the second operating lever rotates backward, the speed of the front wiper is slowly controlled. Therefore, when the driver does not known or remember all of the functions of the multi-function switch, those functions may be easily provided to the driver so that he or she can easily ascertain how to perform said functions, thereby increasing the convenience of the lever operation.

The operation flow of the apparatus for guiding a multi-function switch according to the embodiment of the present invention configured as described above will be described in more detail.

Figure 5:
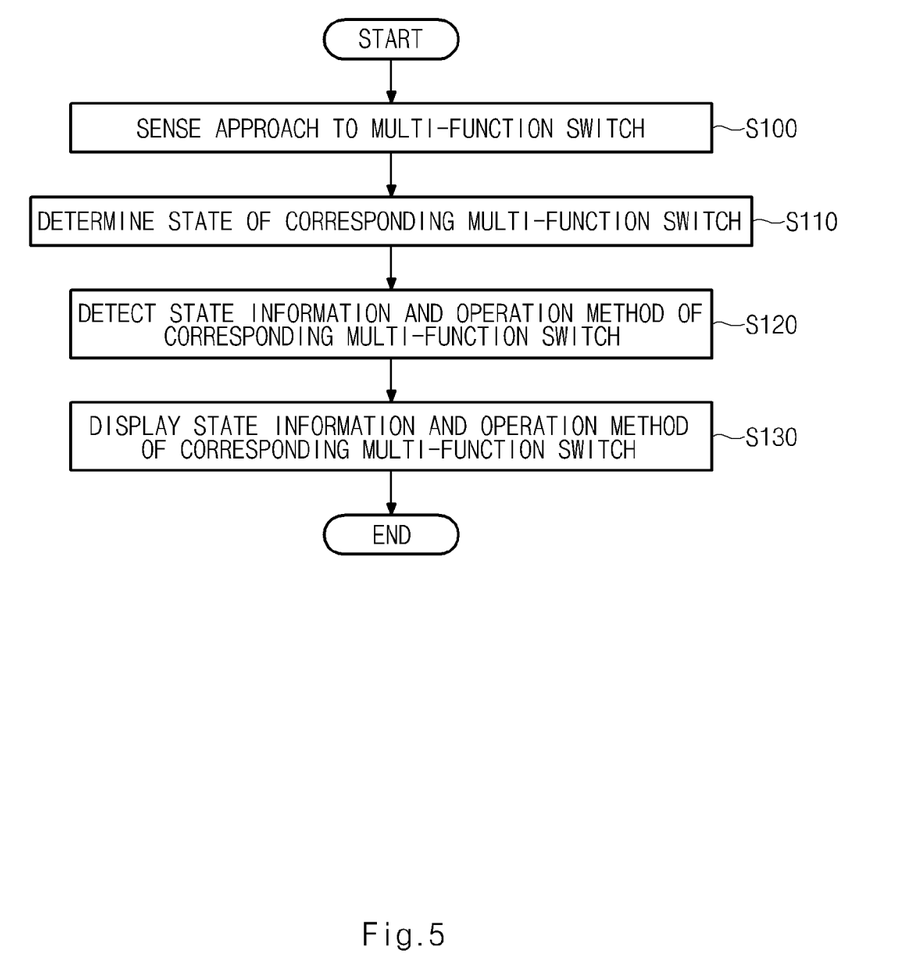
FIG. 5 is a flow chart illustrating an operation flow of a method for guiding a multi-function switch according to an exemplary embodiment of the present invention.

FIG. 5 is a flow chart illustrating an operation flow of a method for guiding a multi-function switch according to an embodiment of the present invention. Referring to FIG. 5, the apparatus for guiding a multi-function switch senses an approach of a user of a multi-function switch (S100). In particular, in 'S100', the approach of the user to the operating lever of the multi-function switch is sensed. In 'S100', when the approach of the user to the multi-function switch is sensed, the apparatus for guiding a multi-function switch determines the current operation state of the corresponding multi-function switch (S110). In more detail, in 'S100', the apparatus for guiding a multi-function switch determines the current operation state of the operating lever to which the approach of the user is sensed. Although not illustrated in FIG. 5, in 'S110', even when the operation of the operating lever is sensed in addition to the approach of the user to the operating lever, it is possible to determine the current operation state of the operating lever that is operated.

Next, the apparatus for guiding a multi-function switch detects the state information of the corresponding multi-function switch and the lever operation method according to the current operation state determining result of the corresponding multi-function switch in "S110" (S120) and displays the detected state information (S130). Here, the apparatus for guiding a multi-function switch may display only the lever operating method in 'S130'. In this case, the apparatus for guiding a multi-function switch may display the state information of the switch and the lever operation method detected in 'S120' on the cluster 20 connected with the apparatus 100 for guiding a multi-function switch.

According to the embodiment of the present invention, it is possible to facilitate the operation of the multi-function switch by displaying the lever operation method of the multi-function switch when the approach of the user to the multi-function switch or an operation thereof is sensed. Further, according to the exemplary embodiment of the present invention, it is possible to further increase the convenience of the lever operation of the user by displaying the lever operation method corresponding to the current operation state of the lever to be operated by the user.

As described above, the apparatus and the method for guiding of multi-function switch are described with reference to the illustrated drawings, but the present invention is no limited to the embodiments and the drawings disclosed in the present specification and therefore, can be modified within the scope of the technical scope of the present invention.

What is claimed is:

1. An apparatus for guiding a multi-function switch, comprising:
   a sensor unit disposed on at least one operating lever of a multi-function switch of a vehicle to sense an approach of a user or an operation of the operating lever, wherein the sensor unit includes a proximity recognition sensor or a touch sensor;
   a processor including:
      a switch state determining unit configured to determine a current operation state of the multi-function switch, when the approach of the user or the operation of the operating lever is sensed by the sensor unit;

an information detection unit configured to detect a lever operation method corresponding to the current operation state of the multi-function switch; and
an output control unit configured to display the detected lever operation method.

2. The apparatus according to claim 1, wherein the sensor includes:
a first sensor disposed on any one of the operating levers disposed at both sides of the multi-function switch to sense the approach of the user or the operation of any one operating lever; and
a second sensor disposed at the other one of the operating levers disposed at both sides of the multi-function switch to sense the approach of the user or the operation of the other operating lever.

3. The apparatus according to claim 2, wherein the switch state determining unit is configured to determine the approach of the user or the current operation state of the operating lever of which the operation is sensed, when the approach of the user or the operation of the operating lever is sensed by at least one of the first sensor and the second sensor.

4. The apparatus according to claim 1, wherein the sensor unit includes a sensor that senses motion and rotation operations in all directions of the operating lever.

5. The apparatus according to claim 1, wherein the processor further includes:
an output unit that is connected with a cluster of the vehicle to output at least one of the detected lever operation methods to the cluster according to control signals from the output control unit.

6. The apparatus according to claim 1, further comprising:
a storage device configured to store state information corresponding to functions implemented by the operating lever of the multi-function switch and the lever operation methods for each state.

7. The apparatus according to claim 1, wherein the output control unit performs a control to display state information on the current operation state of the multi-function switch.

8. A method for guiding a multi-function switch, comprising:
sensing an approach of a user or an operation of the operating lever by a sensor unit disposed on an operating lever of a multi-function switch of a vehicle, wherein the sensor unit includes a proximity recognition sensor or a touch sensor;
determining, by a controller, a current operation state of the multi-function switch, when the approach of the user or the operation of the operating lever is sensed by the sensor unit;
detecting, by the controller, a lever operation method corresponding to the current operation state of the multi-function switch; and
displaying, by the controller, the detected lever operation method.

9. The method according to claim 8, wherein the sensing includes:
sensing an approach of a user to any one of the operating levers disposed at both sides of the multi-function switch or an operation thereof; and
sensing the approach of the user to the other one of the operating levers disposed at both sides of the multi-function switch or the operation thereof.

10. The method according to claim 8, wherein in the determining, the approach of the user or a current operation state of the operating lever of which the operation is detected is determined, among the operating levers disposed on both sides of the multi-function switch.

11. The method according to claim 8, further comprising:
prior to the detecting, storing, by a storage device, state information corresponding to functions implemented by the operating lever of the multi-function switch and the lever operation methods for each state.

12. The method according to claim 8, further comprising:
displaying, the controller, at least one of the detected operation state information and lever operation method on the cluster of the vehicle.

13. The method according to claim 8, further comprising:
performing, by the controller, a control to display state information on the current operation state of the multi-function switch.

14. A non-transitory computer readable medium containing program instructions executed by a processor, the computer readable medium comprising:
program instructions that determine a current operation state of a multi-function switch upon receiving a signal from a sensor unit that a user is approaching the multi-function switch or an operation of an operating lever, wherein the sensor unit includes a proximity recognition sensor or a touch sensor;
program instructions that detect a lever operation method corresponding to the current operation state of the multi-function switch; and
program instructions that display the detected lever operation method.

15. An apparatus for guiding a multi-function switch, comprising:
a sensor unit disposed on at least one operating lever of a multi-function switch of a vehicle to sense an approach of a user or an operation of the operating lever, wherein the sensor unit includes a proximity recognition sensor or a touch sensor;
a processor including:
a switch state determining unit configured to determine a current operation state of the multi-function switch, when the approach of the user or the operation of the operating lever is sensed by the sensor unit;
a storage device configured to store state information corresponding to functions implemented by the operating lever of the multi-function switch and the lever operation methods for each state;
an information detection unit configured to detect a lever operation method corresponding to the current operation state of the multi-function switch; and
an output control unit configured to display the detected lever operation method.

16. The apparatus according to claim 15, wherein the sensor includes:
a first sensor disposed on any one of the operating levers disposed at both sides of the multi-function switch to sense the approach of the user or the operation of any one operating lever; and
a second sensor disposed at the other one of the operating levers disposed at both sides of the multi-function switch to sense the approach of the user or the operation of the other operating lever.

17. The apparatus according to claim 16, wherein the switch state determining unit is configured to determine the approach of the user or the current operation state of the operating lever of which the operation is sensed, when the approach of the user or the operation of the operating lever is sensed by at least one of the first sensor and the second sensor.

18. The apparatus according to claim 15, wherein the processor further includes:

an output unit that is connected with a cluster of the vehicle to output at least one of the detected lever operation methods to the cluster according to control signals from the output control unit.

19. The apparatus according to claim 15, wherein the output control unit performs a control to display state information on the current operation state of the multi-function switch.

* * * * *